US012763115B2

(12) United States Patent
Jang et al.

(10) Patent No.: US 12,763,115 B2
(45) Date of Patent: Oct. 13, 2026

(54) TRANSCEIVER FOR DATA OR SIGNAL TRANSMISSION AND A MEMORY SYSTEM INCLUDING THE TRANSCEIVER

(71) Applicant: SK hynix Inc., Gyeonggi-do (KR)

(72) Inventors: Jun Seo Jang, Gyeonggi-do (KR); Sung Hwa Ok, Gyeonggi-do (KR); Eun Ji Choi, Gyeonggi-do (KR); Jae Hyeong Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 239 days.

(21) Appl. No.: 18/500,124

(22) Filed: Nov. 2, 2023

(65) Prior Publication Data

US 2025/0006231 A1 Jan. 2, 2025

(30) Foreign Application Priority Data

Jun. 27, 2023 (KR) ........................ 10-2023-0082544

(51) Int. Cl.

| | |
|---|---|
| ***G11C 7/08*** | (2006.01) |
| ***G11C 7/10*** | (2006.01) |
| ***G11C 7/20*** | (2006.01) |

(52) U.S. Cl.

CPC .............. *G11C 7/08* (2013.01); *G11C 7/1066* (2013.01); *G11C 7/20* (2013.01)

(58) Field of Classification Search

CPC ........... G11C 7/08; G11C 7/1066; G11C 7/20; G11C 7/1093; G11C 7/02; G11C 7/1084; G11C 7/222; G11C 2207/2254; H04B 1/40; G06F 12/02; H03K 5/133

See application file for complete search history.

(56) References Cited

U.S. PATENT DOCUMENTS

| | | | | |
|---|---|---|---|---|
| 7,292,061 | B2 | 11/2007 | Oh | |
| 7,782,701 | B2 | 8/2010 | Seo et al. | |
| 9,337,825 | B2 * | 5/2016 | Takayanagi | H03K 19/0016 |
| 2011/0193594 | A1 * | 8/2011 | Inukai | G01R 31/2884 326/112 |
| 2014/0131895 | A1 * | 5/2014 | Song | G06F 13/42 257/777 |
| 2020/0136426 | A1 * | 4/2020 | Jackoski | H02M 1/36 |
| 2020/0303325 | A1 * | 9/2020 | Lewis | H10F 39/103 |

* cited by examiner

*Primary Examiner* — Sultana Begum

(74) *Attorney, Agent, or Firm* — IP & T GROUP LLP

(57) ABSTRACT

A transceiver includes a first inverter chain configured to deliver a signal in response to an enable signal and a second inverter chain which is coupled to the first inverter chain in parallel and configured to output a reset value of the signal in response to an inverted enable signal.

20 Claims, 3 Drawing Sheets

TRANSCEIVER FOR DATA OR SIGNAL TRANSMISSION AND A MEMORY SYSTEM INCLUDING THE TRANSCEIVER

CROSS-REFERENCE TO RELATED APPLICATIONS

This patent application claims the benefit of priority under 35 U.S.C. § 119 (a) to Korean Patent Application No. 10-2023-0082544, filed on Jun. 27, 2023, the entire disclosure of which is incorporated herein by reference.

TECHNICAL FIELD

Various embodiments of the present disclosure described herein relate to a transceiver for transmitting or receiving data or a signal, and more particularly, to the transceiver for a high-speed data input/output operation in a low power environment, a memory device including the transceiver, and operation methods thereof.

BACKGROUND

A memory device or a memory system is typically used as an internal circuit, a semiconductor circuit, an integrated circuit, and/or a removable device in a computing system or an electronic apparatus. There are various types of memories, including a volatile memory and a non-volatile memory. The volatile memory may require power to retain data stored therein. The volatile memory may include a random access memory (RAM), a dynamic random access memory (DRAM), a static random access memory (SRAM), a synchronous dynamic random access memory (SDRAM), and the like. The non-volatile memory can retain data stored therein even when power is not supplied. The non-volatile memory may include a NAND flash memory, a NOR flash memory, a Phase Change Random Access Memory (PCRAM), a Resistant Random Access Memory (RRAM), a Magnetic Random Access Memory (MRAM), and the like.

A memory device for storing a large amount of data may include a plurality of memory dies or semiconductor chips, which are coupled to a memory controller configured to control the plurality of memory dies or semiconductor chips. For high-speed data input/output operations, calibration is required to ensure accuracy and reliability in transmission and reception of data or signals.

BRIEF DESCRIPTION OF THE DRAWINGS

The description herein makes reference to the accompanying drawings wherein like reference numerals refer to like parts throughout the figures.

DETAILED DESCRIPTION

Figure 1:
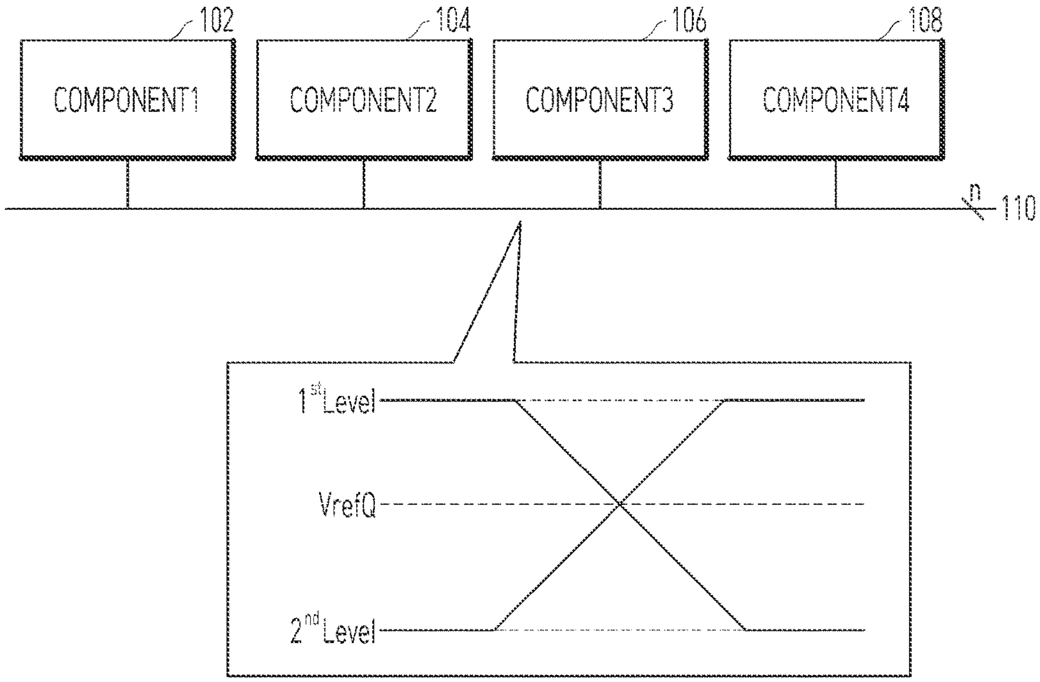
FIG. 1 is a diagram illustrating an electronic apparatus according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term ‘based on’ is used to describe one or more factors that affect a determination. This term does not foreclose additional factors that may affect a determination. That is, a determination may be solely based on those factors or based, at least in part, on those factors. Consider the phrase “determine A based on B.” While in this case, B is a factor that affects the determination of A, such a phrase does not foreclose the determination of A from also being based on C. In other instances, A may be determined based solely on B.

An embodiment of the present disclosure may provide a transceiver for improving reliability and accuracy of transmitting and receiving data or signals between two components.

An embodiment of the present disclosure can reduce power consumed in a process of transmitting and receiving data or signals in a low-power or high-speed operation environment and reduce an error occurring in the process of transmitting and receiving, so that it could be achieved in a storage system or a storage device to improve reliability and accuracy of data or signal transmission and reception in a data processing apparatus designed for high-speed data input and output in a low-power environment.

An embodiment of the present disclosure can provide a transceiver configured to, while transmitting or receiving data or signals, reduce an amount of current consumed in a standby state without transmission or reception of data or signals in a storage system, even if it is difficult to estimate a timing of transmission or reception of data or signals or it intermittently transmits or receives data or signals.

In an embodiment of the present disclosure, a transceiver can include a first inverter chain configured to deliver a signal in response to an enable signal; and a second inverter chain coupled to the first inverter chain in parallel and configured to output a reset value of the signal in response to an inverted enable signal.

The transceiver can further include a reset circuit configured to reset the signal which is input to the first inverter chain and the second inverter chain.

The reset circuit can reset the data or the signal in response to the inverted enable signal.

The transceiver can further include a first pin or a first pad configured to transfer the signal; a second pin or a second pad configured to transfer a reference voltage used for determining a value of the signal; a sense amplifier configured to sense and amplify the value of the signal based on the reference voltage; and a tri-state inverter configured to either transfer an output of the sense amplifier to the first inverter chain or decouple the sense amplifier from the first inverter chain.

The first inverter chain and the second inverter chain can individually include a same number of inverters which are connected in series.

In the transceiver, the first and second inverter chains includes a same number of stages, each stage comprising an inverter. Two inverters of a same stage in the first and second inverter chains can have common input and output.

Each inverter included in the first inverter chain can be coupled to each of power-gating transistors controlled by the enable signal.

Each inverter included in the second inverter chain can be coupled to each of transistors controlled by the inverted enable signal.

The transceiver can further include a synchronization circuit configured to receive outputs of the first inverter chain and the second inverter chain and output the signal in response to a synchronization signal.

An inverter included in the second inverter chain can be configured to have a slower operation speed than an inverter included in the first inverter chain.

In another embodiment, a memory system can include plural memory dies configured to store data; and a memory controller coupled to the plural memory dies via a common data channel and configured to control the plural memory dies. At least one of the plural memory dies and the controller can include a transceiver. The transceiver can include a first inverter chain configured to deliver a signal in response to an enable signal; and a second inverter chain coupled to the first inverter chain in parallel and configured to output a reset value of the signal in response to an inverted enable signal of the enable signal.

The signal can be input or output via the common channel.

The transceiver can further include a reset circuit configured to reset the signal which is input to the first inverter chain and the second inverter chain.

The reset circuit can reset the signal in response to the inverted enable signal.

The transceiver can further include a first pin or a first pad for transferring the signal; a second pin or a second pad for transferring a reference voltage used for determining a value of the signal; a sense amplifier configured to sense and amplify the value of the signal based on the reference voltage; and a tri-state inverter configured to either transfer an output of the sense amplifier to the first inverter chain or decouple the sense amplifier from the first inverter chain.

The first inverter chain and the second inverter chain can individually include a same number of inverters which are connected in series.

The first and second inverter chains includes a same number of stages, each stage comprising an inverter. Two inverters of a same stage in the first and second inverter chains can have common input and output.

Each inverter included in the first inverter chain can be coupled to each of power-gating transistors controlled by the enable signal. Each inverter included in the second inverter chain can be coupled to each of transistors controlled by the inverted enable signal.

The transceiver can further include a synchronization circuit configured to receive outputs of the first inverter chain and the second inverter chain and output the signal in response to a synchronization signal.

An inverter included in the second inverter chain can be configured to have a slower operation speed than an inverter included in the first inverter chain.

Embodiments will now be described with reference to the accompanying drawings, wherein like numbers reference like elements.

FIG. 1 illustrates an electronic apparatus according to an embodiment of the present disclosure.

Referring to FIG. 1, an electronic device may include a plurality of components 102, 104, 106, 108. The plurality of components 102, 104, 106, 108 can share a signal line 110 with each other. The plurality of components 102, 104, 106, 108 may transmit and receive signals through the signal line 110. In an embodiment, the signal line 110 may be configured as a channel or a bus which is capable of simultaneously transmitting and receiving signals of n bits, where n is a positive integer greater than 2. Herein, the signals can include data transferred between at least two components among the plurality of components 102, 104, 106, 108. Further, the signal line 110 can be used as a data line for transmitting the data.

In an embodiment, the plurality of components 102, 104, 106, 108 may transmit and receive signals having two levels (e.g., $1^{st}$ level and $2^{nd}$ level). Such signals (or data) may be digital signals (or digital data) having a value of '1' or '0' corresponding to the two levels (e.g., $1^{st}$ level and $2^{nd}$ level). A plurality of components 102, 104, 106, 108 operating at a high speed may transmit and receive a signal sequence (or a data sequence) including a plurality of bits. An error in the signal sequence including '0' or '1' could be reduced or eliminated if accuracy and reliability of signal transmission or data transmission between a transmission component and a reception component are guaranteed. To this end, the plurality of components 102, 104, 106, 108 can include a transceiver which is configured to either receive and recognize a value (e.g., either $1^{st}$ level or $2^{nd}$ level) of the signal transmitted via the signal line 110 based on a reference voltage VrefQ or transmit the signal having a specific value (e.g., either $1^{st}$ level or $2^{nd}$ level) via the signal line 110.

The transceiver is a term mainly used in communication devices. The transceiver could be understood as an electronic device that combines a transmitter and a receiver into one package. The transceiver can transmit or receive the signal through wired or wireless communication. Additionally, the transceiver may be used to perform a function of a transmitting device or a receiving device in a cable or optical fiber system.

The signal transmitted and received through the signal line 110 are transmitted from one of the plurality of components 102, 104, 106, 108 coupled through the signal line 110 and received from another one of the plurality of components 102, 104, 106, 108. The plurality of components 102, 104, 106, 108 that transmit and receive the signal may use the same power source or different power sources. Herein, the same power source may indicate that a power voltage supplied to the plurality of components 102, 104, 106, 108 is supplied via the same power line. Even if the power voltage is at the same level when supplied to the plurality of components 102, 104, 106, 108 through different power lines, power supplied to the plurality of components 102, 104, 106, 108 might not be the same because the different power lines can have different electrical loads. To transform the signal received from an outside in response to the power supplied to each of the plurality of components 102, 104, 106, 108, the transceiver can include an inverter chain. The inverter chain can include plural stages of inverters connected in series.

The transceiver may include the inverter chain for a variety of reasons. For example, in the transceiver, the inverter chain may be used for the purpose of signal amplification. A weak input signal could be amplified through the inverter chain. Each inverter stage in the inverter chain can provide signal amplification to increase a strength of the input signal, so that this amplified signal could then be transmitted or further processed.

Further, the inverter chain can be used for voltage level conversion. A transceiver can often operate at different voltage levels for data or signal transmission and reception. The inverter chain can be used to change, adjust, or convert a voltage level of the signal to ensure compatibility between different sections of the transceiver which are distinguishable based on different operation voltages.

Additionally, the inverter chain can be used for timing control (e.g., synchronization). To provide the timing control or the synchronization, the transceiver can achieve accurate signal timing by using a preset delay and phase of the inverter chain or control by selecting one of multiple delays and phases in the inverter chain, so that an operation for transmitting, receiving, or synchronizing the data or the signal between different components can be appropriately achieved.

Additionally, the transceiver may use the inverter chain for noise immunity. Because each inverter included in the inverter chain has noise canceling characteristics, the inverter chain can be included to make the transceiver more resilient to external noise or interference. For example, the inverter chain could work as a buffer to reduce an impact of noise on the data or the signal transmitted or received through the transceiver.

In an embodiment, the inverter chain may be used to reduce the number of transistors included in the transceiver. By utilizing the inverter chain for various functions described above (e.g., data or signal amplification or voltage level conversion), the transceiver could be implemented with a fewer number of transistors, enabling a more efficient and compact design. The transceiver including the inverter chain will be described later with reference to FIGS. 3 and 4.

Figure 2:
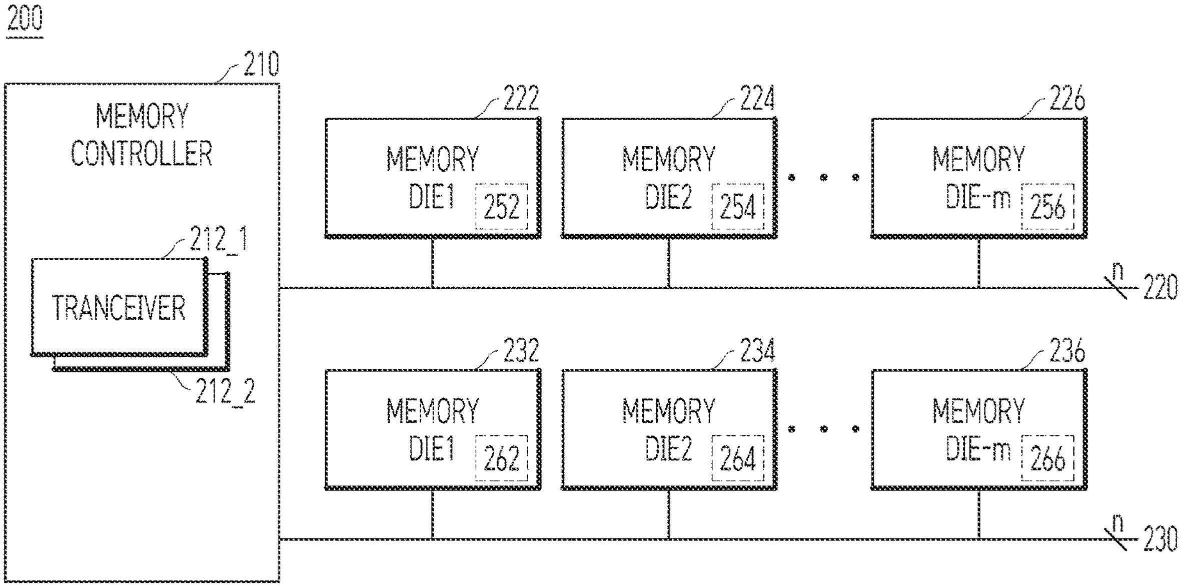
FIG. 2 is a diagram illustrating a memory system according to an embodiment of the present disclosure.

FIG. 2 illustrates a memory system 200 according to an embodiment of the present disclosure.

Referring to FIG. 2, the memory system 200 may include a memory controller 210 and a plurality of memory dies 222, 224, 226, 232, 234, 236. The memory controller 210 may be connected to the plurality of memory dies 222, 224, 226, 232, 234, 236 through a plurality of channels 220 230. In an embodiment, the memory controller 210 and the plurality of memory dies 222, 224, 226, 232, 234, 236 described in FIG. 2 may correspond to the plurality of components 102, 104, 106, 108 shown in FIG. 1.

Each of the plurality of memory dies 222, 224, 226, 232, 234, 236 may include a plurality of volatile memory cells or a plurality of non-volatile memory cells. In an embodiment, each of the plurality of memory dies 222, 224, 226, 232, 234, 236 may include at least one memory bank or at least one memory plane. Further, in an embodiment, the plurality of memory dies 222, 224, 226, 232, 234, 236 may all have the same internal configuration or may have different internal configurations. In an embodiment, the plurality of memory dies 222, 224, 226, 232, 234, 236 which are coupled to the memory controller 210 may be included in different memory chips. Configurations in the plurality of memory dies 222, 224, 226, 232, 234, 236 may vary depending on a purpose of usage, signal (or data) input/output performance, and the like of the memory system 200. An embodiment of the present disclosure might not be limited to internal configurations of the plurality of memory dies 222, 224, 226, 232, 234, 236.

A plurality of memory dies are connected to one of the channels 220 230. For example, a plurality of first memory dies 222, 224, 226 may be connected to the memory controller 210 through a first channel 220. A plurality of second memory dies 232, 234, 236 may be coupled to the memory controller 210 via a second channel 230. Each of the first and second channels 220 230 may include a plurality of signal (or data) lines through which data including a plurality of bits or a signal (e.g., command, response, etc.) including a plurality of bits may be transmitted simultaneously. Referring to FIG. 2, each of the first and second channels 220 230 may include n-bit signal (or data) lines, where n is a positive integer greater than 2.

The memory controller 210 may be coupled to the plurality of memory dies 222, 224, 226, 232, 234, 236 to perform signal (or data) communication. For example, the memory controller 330 can receive a command (CMD), address (Addr), data, etc. from an external device, and transfer a response (Res), status information (Stat), data, etc. to the external device. Herein, the external device may include a computing device for storing data in the plurality of memory dies 222, 224, 226, 232, 234, 236 or reading data stored in the plurality of memory dies 222, 224, 226, 232, 234, 236.

For data communication, the memory controller 210 and the plurality of memory dies 222, 224, 226, 232, 234, 236 can include transceivers 212_1, 212_2, 252, 254, 256, 262, 264, and 266. Transceivers 212_1, 212_2, 252, 254, 256, 262, 264, and 266 can transmit or receive signals (or data) via the first and second channels 220 230 between the memory controller 210 and the plurality of memory dies 222, 224, 226, 232, 234, 236.

The signals transmitted through the channels 220 230 between the memory controller 210 and the plurality of memory dies 222, 224, 226, 232, 234, 236 can include a signal sequence (or a data sequence) including '0' or '1' as described in FIG. 1. For example, the signal sequence including '0' or '1' may include consecutive signals (or data) having a value of two levels (e.g., $1^{st}$ level or $2^{nd}$ level).

Figure 3:
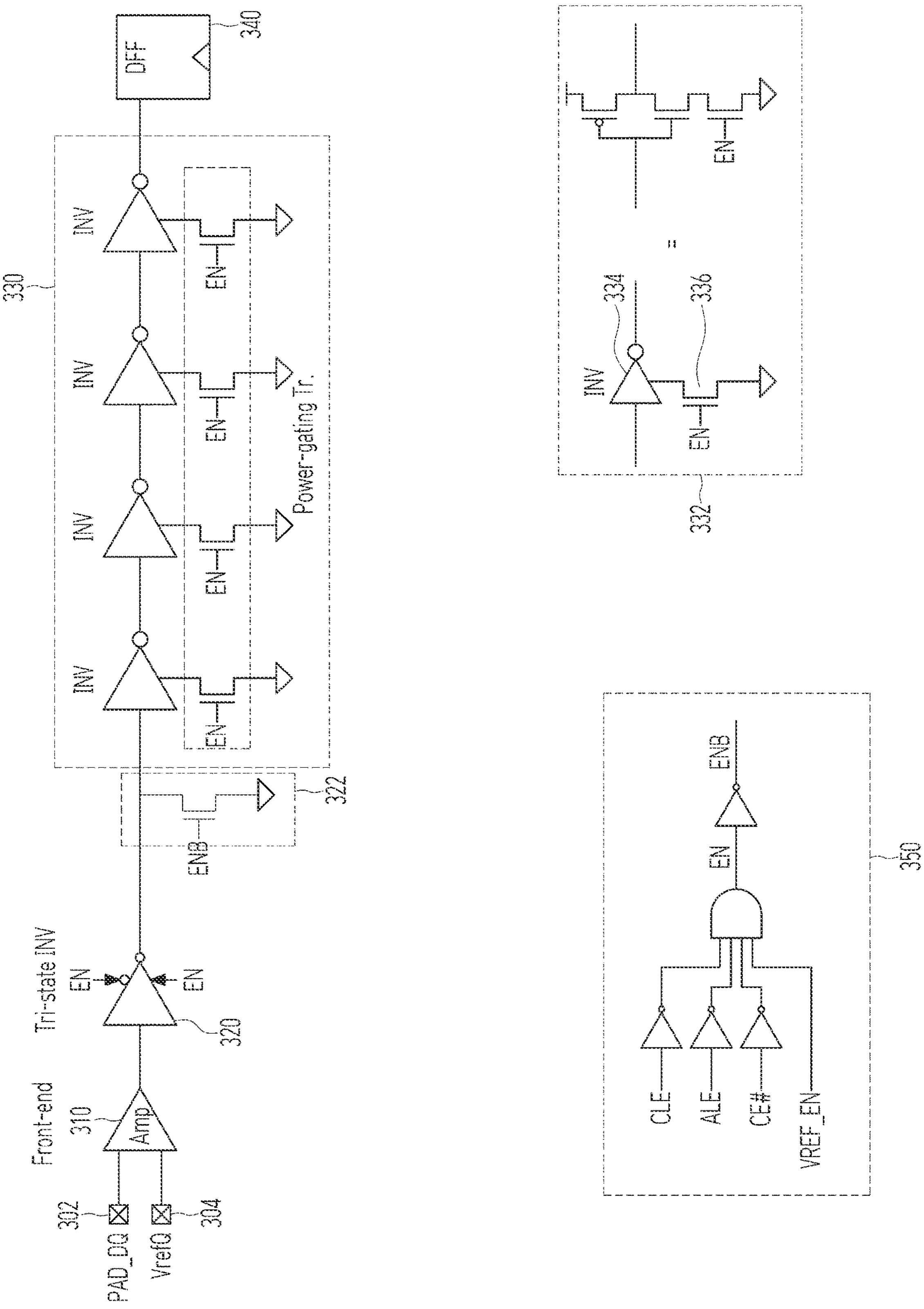
FIG. 3 is a diagram illustrating a first transceiver according to an embodiment of the present disclosure.

FIG. 3 illustrates a first transceiver according to an embodiment of the present disclosure.

Referring to FIG. 3, the first transceiver may include a first pad (or a first pin) PAD_DQ 302 via which data is transmitted and a second pad (or a second pin) 304 via which a reference voltage VrefQ is transmitted. In an embodiment, the first pad 302 can be used to receive a control signal, rather than data, transmitted by the memory controller 210 described in FIG. 2.

The first transceiver described in FIG. 3 can receive the reference voltage VrefQ through the second pad 304. However, in an embodiment, the first transceiver can use the reference voltage VrefQ generated from and supplied by a reference voltage generator based on a power supply voltage.

The first transceiver may include a sense amplifier 310. The sense amplifier 310 may sense and amplify a value of data transmitted through the first pad 302 based on the reference voltage VrefQ. The value of data could be determined or recognized at one of two levels (e.g., $1^{st}$ level or $2^{nd}$ level as described in FIG. 1). The sense amplifier 310 can sense and amplify the data transmitted through the first pad 302 to reduce a noise such as crosstalk, ringing, overshooting, or undershooting which may occur in a process of transmitting or receiving the data.

The first transceiver may include a tri-state inverter 320. The tri-state inverter 320 is a circuit that can operate in either an output signal state corresponding to one of two levels (e.g., outputting $1^{st}$ level or $2^{nd}$ level) or an infinite impedance state (e.g., 'off state' or 'decouple state') in which the sense amplifier 310 and another logic or circuit (e.g., an inverter chain 330) are electrically decoupled.

An operation mode of the tri-state inverter 320 may be determined depending on an input state/value of an enable signal EN. For example, the first transceiver may deliver data transmitted through the first pad 302 into an inside when the enable signal EN having a logic high level is applied to the tri-state inverter 320. The tri-state inverter 320 may output a value corresponding to one of two levels (e.g., $1^{st}$ level or $2^{nd}$ level) in response to an output of the sense amplifier 310.

On the other hand, during a reset operation in which the first transceiver does not deliver any data transmitted through the first pad 302 into the inside, the enable signal EN having a logic low level may be applied to the tri-state inverter 320. The tri-state inverter 320 may be in the infinite impedance state, which could have an effect of releasing the connection between the tri-state inverter 320 and the inverter chain 330 in the first transceiver.

The tri-state inverter 320 is a current source inverter (CSI) which has inherent short-circuit protection, robustness, and easy direct current control capabilities, so that the tri-state inverter 320 can easily supply capacitance and/or low impedance. In a typical inverter, an output has a low voltage value when an input has a high voltage value, whereas the output has a high voltage value when the input has a low voltage value. However, the tri-state inverter 320 can use the enable signal EN to make an output node to have the infinite impedance state. When the tri-state inverter 320 is in the infinite impedance state, the tri-state inverter 320 could be electrically decoupled to the inverter chain 330.

The output of the tri-state inverter 320 is input to the inverter chain 330. A reset circuit 322 may be disposed between the tri-state inverter 320 and the inverter chain 330 in the first transceiver. The reset circuit 322 may reset the input of the inverter chain 330 to a logic value of '0' during the reset operation. The reset circuit 322 is connected to a ground voltage node. The reset circuit 322 may include a transistor controlled by an inverted enable signal ENB which is an inversion signal ENB of the enable signal EN.

The first transceiver device may include the inverter chain 330. The inverter chain 330 is a circuit used in a digital electronic circuit. In an embodiment, the inverter chain 330 can be composed of logic gates. Individual inverters included in the inverter chain 330 can serve to invert an input signal. As described above, the inverter chain 330 can be included in the first transceiver for several reasons such as signal amplification, voltage level conversion, timing control, and noise immunity, according to an embodiment.

Referring to FIG. 3, the inverter chain 330 can include four inverters connected in series. In an embodiment, the number of inverters included in the inverter chain 330 may be two or more. Each stage 332 of the inverter chain 330 may include a power-gated inverter which consists of an inverter 334 and a power-gating transistor 336. The power-gating transistor 336 is connected between the inverter 334 and a ground voltage node. The power-gating transistor 336 can be controlled by the enable signal EN.

The power-gating transistor 336 is a type of transistor used to control power supply to a specific circuit or component in an electronic device. The power-gating transistor 336 can work as a switch to turn on or off the circuit or component, such as the inverter chain 330, to save energy (e.g., reduce power consumption) while the circuit or component is not in use. For example, when the power-gating transistor 336 is turned off, the power supplied to the inverter chain 330 could be cut off to avoid or reduce unnecessary power consumption.

The power-gating transistor 336 could be included in the first transceiver or another circuit or logic to reduce power consumption during an idle or standby state/mode. The power-gating transistor 336, which selectively turns off power to a specific part of a device which is not actively being used, could improve energy efficiency as well as reduce power consumption of the device, such as the memory system 200 described in FIG. 2. This may help extend a battery life of portable devices that can include the memory system 200.

In the first transceiver, the enable signal EN can be used as a control signal to determine when or whether the power-gating transistor 336 is turned on or off. The enable signal EN may supply the power to the inverter chain 330 in the first transceiver only when the power is needed for operating the inverter chain 330. The enable signal may not supply the power to the inverter chain 330 when the power is not needed in the inverter chain 330.

By applying the power-gating transistor 336 to the inverter chain 330, power consumption of the inverter chain 330 could be reduced and energy efficiency in the first transceiver could be improved through selective power control. Additionally, the power-gating transistor 336 can reduce a leakage current of the inverter chain 330. The power-gating transistor 336 could reduce the leakage power, which is included in the power consumed by the inverter chain 330, even when elements in the inverter chain 330 are not actively switched or controlled.

In an embodiment, the power-gating transistor 336 may selectively gate (supply or not) the power so that an active section of the inverter chain 330 can operate with reduced interference from an inactive section. Through this, the power-gating transistor 336 could improve signal integrity and overall performance of the inverter chain 330.

Additionally, the power-gating transistor 336 can easily measure a quiescent current of the inverter chain 330 in the first transceiver. The power-gating transistor 336 makes it easier to isolate and test a specific stage of the inverter chain 330.

The first transceiver may further include a control circuit 350. The control circuit 350 may generate the enable signal EN and the inverted enable signal ENB to control the tri-state inverter 320, the reset circuit 322, and the inverter chain 330. Referring to FIGS. 2 and 3, the control circuit 350 in the first transceiver, which is included in the plurality of memory dies 222, 224, 226, 232, 234, 236, can receive a command latch enable signal CLE, an address latch enable signal ALE, and a chip enable signal CE #input from the memory controller 210), and generate the enable signal EN and the inverted enable signal ENB. Additionally, the control circuit 350 may generate the enable signal EN and the inverted enable signal ENB based on a reference voltage enable signal VREF_EN. In an embodiment, various control signals may be input to the control circuit 350 that generates the enable signal EN and the inverted enable signal ENB.

Referring to FIG. 3, the control circuit 350 can include plural first inverters, a first logic gate, and a second inverter. Each of the plural first inverters can be configured to invert each of the command latch enable signal CLE, the address latch enable signal ALE, and the chip enable signal CE #. The first logic gate can be configured to generate the enable signal EN by performing a logical product (AND) operation on outputs of the plural first inverters. The second inverter can be configured to generate the inverted enable signal ENB by inverting an output of the first logic gate. In an embodiment, the reference voltage enable signal VREF_EN can be further input to the first logic gate. The first logic gate may generate the enable signal EN based on the reference voltage enable signal VREF_EN.

The first transceiver may include a synchronization circuit 340. Referring to FIG. 3, the output of the inverter chain 330 is input to the synchronization circuit 340. The synchronization circuit 340 may align the data transmitted through the first pad 302 in response to a preset synchronization signal. In an embodiment, the synchronization circuit 340 may include a flip-flop (e.g., a D F/F). The flip-flop is a circuit that can have two stable states and store state information in an electronic circuit. The flip-flop can change its state based on one or more control input signals (e.g., the synchronization signal), and could also output a logical complement along with the state information.

As an operating speed of the electronic device or the memory system 200 described in FIG. 1 or 2 increases, a speed of transmitting and receiving the signal (e.g., data input/output operation) could also increase. As the speed of transmitting and receiving the signal increases, a driving current or a drain current in a linear regime for transistors included in the first transceiver could increase. In addition, an off-state current may increase due to a trade-off in the increase in the driver current or the drain current in the linear regime.

In the memory system 200 described in FIG. 2, there is an idle or standby state/mode where the memory system 200 is not used by a host and a user. Competitiveness for the memory system 200 could increase when current consumption in the standby state is reduced. Therefore, to suppress the increase in the off-state current, the power-gating transistor 336 may be added to the inverter chain 330.

During the reset operation, an input node of the inverter chain 330 can be reset by the reset circuit 322. Further, during the reset operation, individual inverters in the inverter chain 330 do not operate due to the power-gating transistor 336. Power consumption could be reduced by adding the power-gating transistor 336 to the inverter chain 330. However, during the reset operation, the output of the inverter chain 330 can float, so that it may be impossible to recognize a status at the output node of the inverter chain 330, or an abnormal standby current may occur.

Figure 4:
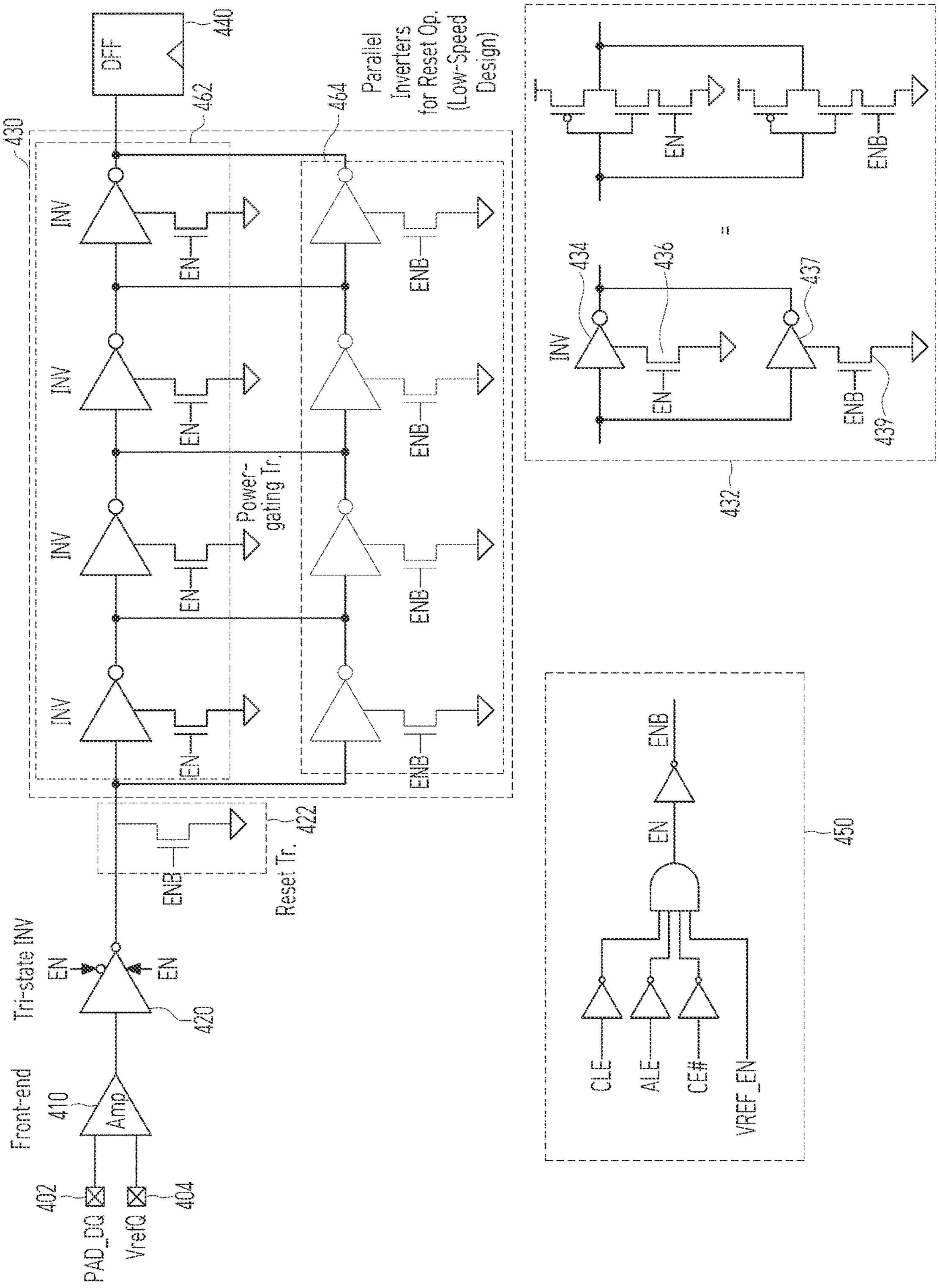
FIG. 4 is a diagram illustrating a second transceiver according to another embodiment of the present disclosure.

FIG. 4 illustrates a second transceiver according to another embodiment of the present disclosure.

Referring to FIG. 4, the second transceiver can include a first pad (or a first pin) 402, a second pad (or a second pin) 404, a sense amplifier 410, a tri-state inverter 420, a reset circuit 422, an inverter chain 430, and a synchronization circuit 440. Additionally, the second transceiver may include a control circuit 450 for controlling the inverter chain 430. For convenience of description, configuration and operation will be described focusing on the inverter chain 430, which is a main difference between the second transceiver illustrated in FIG. 4 and the first transceiver illustrated in FIG. 3.

The inverter chain 330 described in FIG. 3 can include a single inverter chain in which a plurality of inverters are connected in series. However, the inverter chain 430 described in FIG. 4 can include two inverter chains 462 464. Each of the two inverter chains 462 464 can individually include a plurality of inverters connected in series. The two inverter chains 462 464 may be connected in parallel. Each stage of the inverter chain 330 illustrated in FIG. 3 includes the power-gating transistor 336 connected to the inverter 334 to reduce a standby current. Likewise, each stage 432 of a first inverter chain 462 included in the inverter chain 430 illustrated in FIG. 4 may also include a power-gating transistor 436 connected to an inverter 434. Further, in the inverter chain 430, each stage of the first inverter chain 462 may be connected in parallel to each stage of the second inverter chain 464.

The first inverter chain 462 in the inverter chain 430 can transfer the signal output from the tri-state inverter 420 to the synchronization circuit 440 in response to the enable signal EN. During a reset operation, the second inverter chain 464 can transfer a reset value at an input of the inverter chain 430, which is reset by the reset circuit 422 in response to the inverted enable signal ENB, as an output of the inverter chain 430. For example, when the enable signal EN has a logic high level and the inverted enable signal ENB has a logic low level, the first inverter chain 462 can transmit the signal but the second inverter chain 464 may not work. On the other hand, when the enable signal EN has the logic low level and the inverted enable signal ENB has the logic high level, the first inverter chain 462 may not operate but the second inverter chain 464 can transmit the reset value. Accordingly, the second inverter chain 464 can prevent the output of the inverter chain 430 from floating or being in an unknown output level state during the reset operation. Further, the second inverter chain 464 can reduce the abnormal standby current that may occur in the inverter chain 430.

Referring to FIG. 4, each stage 432 of the second inverter chain 464 may also include similar components (e.g., an inverter and a transistor) to each stage of the first inverter chain 462. However, the inverter 437 and the transistor 439 included in each stage of the second inverter chain 464 are the inverter 434 and the power-gating transistor 436 included in each stage of the first inverter chain 462 may have different operating characteristics. This is because the first inverter chain 462 is used in the second transceiver to transmit the signal transmitted through the first pad 402, while the second inverter chain 464 is not used to transmit any data or any signal. The second inverter chain 454 can be designed to prevent the output of the inverter chain 430 from becoming unstable during the reset operation. Accordingly, the inverter 434 and the power-gating transistor 436 included in each stage of the first inverter chain 462 can be designed to have fast operation speed characteristics. On the other hand, the inverter 437 and transistor 439 included in each stage of the second inverter chain 464 may have a slower operating speed than the inverter 434 and the power-gating transistor 436 in the first inverter chain 462. In addition, the inverter 437 and transistor 439 included in each stage of the second inverter chain 464 can be designed to have a smaller operation current and a smaller size than the inverter 434 and the power-gating transistor 436 in the first inverter chain 462.

The plurality of parallelly-coupled inverter chains 462 464 included in the inverter chain 430 may be different from typical parallelly-coupled inverter chains. The typical parallelly-coupled inverter chains are intended to generate an improved output voltage by taking advantage of the characteristics of the parallel configuration to increase power capacity and distribution, thereby improving voltage regulation and stability. However, the plurality of parallelly-coupled inverter chains 462 464 described in FIG. 4 can have different operation timings based on different control signals (i.e., EN, ENB).

Further, the typical parallelly-coupled inverter chains are intended to provide redundancy for improving reliability and fault tolerance so that, even if one inverter chain fails or malfunctions, the other inverter chain can continue to supply data, signals, or power. However, the plurality of parallelly-coupled inverter chains 462 464 described in FIG. 4 may not be intended for redundancy (i.e., one inverter chain used for replacing another inverter chain). Accordingly, it could be likely that the inverter chain 430 may not have some issues such as complexity, synchronization difficulty, size increase, or loss and inefficiency, which the typical parallelly-coupled inverter chains may have.

As above described, an apparatus for transmitting and receiving data or signals according to an embodiment of the present disclosure can reduce current consumption and errors in a process of transmitting and receiving data or signals at high speed in a low-power environment.

In addition, in a memory device, a storage device, or a system including a memory device or a storage device, which includes a transceiver for data transmission/reception according to an embodiment of the present disclosure, power consumption could be reduced, so that operational safety and reliability could be improved.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A transceiver comprising:
a first inverter chain configured to deliver a signal in response to an enable signal; and
a second inverter chain coupled to the first inverter chain in parallel and configured to output a reset value of the signal in response to an inverted enable signal,
wherein only one of the first inverter chain or the second inverter chain operates exclusively for delivering respectively the signal or the reset value of the signal based on the enable signal and the inverted enable signal.

2. The transceiver according to claim 1, further comprising:
a reset circuit configured to reset the signal which is input to the first inverter chain and the second inverter chain,
wherein the second inverter chain outputs the reset value while the first inverter chain does not operate.

3. The transceiver according to claim 2, wherein the reset circuit resets the signal in response to the inverted enable signal.

4. The transceiver according to claim 2, further comprising:
a first pin or a first pad configured to transfer the signal;
a second pin or a second pad configured to transfer a reference voltage used for determining a value of the signal;
a sense amplifier configured to sense and amplify the value of the signal based on the reference voltage; and
a tri-state inverter configured to either transfer an output of the sense amplifier to the first inverter chain or decouple the sense amplifier from the first inverter chain.

5. The transceiver according to claim 1, wherein the first inverter chain and the second inverter chain individually comprise a same number of inverters which are connected in series.

6. The transceiver according to claim 5, wherein the first and second inverter chains includes a same number of stages, each stage comprising an inverter, and
wherein two inverters of a same stage in the first and second inverter chains have common input and output.

7. The transceiver according to claim 1, wherein each inverter included in the first inverter chain is coupled to each of power-gating transistors controlled by the enable signal.

8. The transceiver according to claim 1, wherein each inverter included in the second inverter chain is coupled to each of transistors controlled by the inverted enable signal.

9. The transceiver according to claim 1, further comprising:
a synchronization circuit configured to receive outputs of the first inverter chain and the second inverter chain and output the signal in response to a synchronization signal.

10. The transceiver according to claim 1, wherein an inverter included in the second inverter chain is configured to have a slower operation speed than an inverter included in the first inverter chain.

11. A memory system comprising:
plural memory dies configured to store data; and
a memory controller coupled to the plural memory dies via a common channel and configured to control the plural memory dies,
wherein at least one of the plural memory dies and the controller comprises a transceiver comprising:
a first inverter chain configured to deliver a signal in response to an enable signal; and
a second inverter chain coupled to the first inverter chain in parallel and configured to output a reset value of the signal in response to an inverted enable signal, and
wherein only one of the first inverter chain or the second inverter chain operates exclusively for delivering respectively the signal or the reset value of the signal based on the enable signal and the inverted enable signal.

12. The memory system according to claim 11, wherein the signal is input or output via the common channel.

13. The memory system according to claim 11, wherein the transceiver further comprises:
a reset circuit configured to reset the signal which is input to the first inverter chain and the second inverter chain,
wherein the second inverter chain outputs the reset value while the first inverter chain does not operate.

14. The memory system according to claim 13, wherein the reset circuit resets the signal in response to the inverted enable signal.

15. The memory system according to claim 13, wherein the transceiver further comprises:
a first pad configured to receive the signal;
a second pad configured to receive a reference voltage used for determining a value of the signal;
a sense amplifier configured to sense and amplify the value of the signal based on the reference voltage; and
a tri-state inverter configured to either transfer an output of the sense amplifier to the first inverter chain or decouple the sense amplifier from the first inverter chain.

16. The memory system according to claim 11, wherein the first inverter chain and the second inverter chain individually comprise a same number of inverters which are connected in series.

17. The memory system according to claim 16, wherein the first and second inverter chains includes a same number of stages, each stage comprising an inverter, and
wherein two inverters of a same stage in the first and second inverter chains have common input and output.

18. The memory system according to claim 11, wherein each inverter included in the first inverter chain is coupled to each of power-gating transistors controlled by the enable signal, and
wherein each inverter included in the second inverter chain is coupled to each of transistors controlled by the inverted enable signal.

19. The memory system according to claim 11, wherein the transceiver further comprises:
a synchronization circuit configured to receive outputs of the first inverter chain and the second inverter chain and output the signal in response to a synchronization signal.

20. The memory system according to claim 11, wherein an inverter included in the second inverter chain is configured to have a slower operation speed than an inverter included in the first inverter chain.

* * * * *